United States Patent [19]

Kashida et al.

[11] Patent Number: 5,139,633
[45] Date of Patent: Aug. 18, 1992

[54] FILM-FORMING ON SUBSTRATE BY SPUTTERING

[75] Inventors: Meguru Kashida; Yoshihiko Nagata; Hitoshi Noguchi, all of Gunma, Japan

[73] Assignee: Shin-Etsu Chemical Co., Ltd., Tokyo, Japan

[21] Appl. No.: 729,450

[22] Filed: Jul. 12, 1991

[30] Foreign Application Priority Data

Aug. 8, 1990 [JP] Japan .................................. 2-209767

[51] Int. Cl.⁵ .............................................. C23C 14/34
[52] U.S. Cl. ............................ 204/192.15; 204/192.23
[58] Field of Search ...................... 204/192.12, 298.23, 204/298.27, 298.29, 192.15, 192.14, 192.22, 192.23

[56] References Cited

U.S. PATENT DOCUMENTS

| | | | |
|---|---|---|---|
| 4,022,947 | 5/1977 | Grubb et al. | 204/298.29 X |
| 4,132,624 | 1/1979 | King et al. | 204/298.29 |
| 4,437,966 | 3/1984 | Hope et al. | 204/298.29 |
| 4,851,095 | 7/1989 | Scobey et al. | 204/298.29 X |
| 4,988,424 | 1/1991 | Woodward et al. | 204/298.29 X |

FOREIGN PATENT DOCUMENTS

| | | |
|---|---|---|
| 105407 | 4/1984 | European Pat. Off. . |
| 0142568 | 7/1980 | Fed. Rep. of Germany ........................ 204/298.29 |
| 228421 | 10/1985 | Fed. Rep. of Germany . |

OTHER PUBLICATIONS

J. of Vac. Sci. Sci. Technol., vol. 8, May 1990, S. Swann et al, "Film Thickness distribution control with off-axis . . . " pp. 1299-1303.
Patent Abstracts of Japan, vol. 10, 199 Jul. 11, 1986, JP A-61-041766 Hitachi Ltd. Feb. 28, 1986.
Patent Abstracts of Japan, vol. 12, 446 Nov. 24, 1988, JP-A-63-171880 Fuji Electric Co., Jul. 15, 1988.
Patent Abstracts of Japan, vol. 10, 245, Aug. 22, 1986, JP A-61- 0766763 Fujitsu Ltd. Apr. 19, 1986.
Patent Abstracts of Japan, vol. 6, 214, Oct. 27, 1982, JP A 57-120669 Mitsubishi Denki K.K. Jul. 27, 1982.
Patent Abstracts of Japan, vol. 6, 54, Apr. 9, 1982, JP A 56-166375 Kokusai Electric Co., Ltd., Dec. 21, 1981.
Patent Abstracts of Japan, vol. 7, 281, Dec. 15, 1983, JP A 58-161993 Nippon Denshin Denwa Kosha, Sep. 26, 1983.

*Primary Examiner*—Nam Nguyen
*Attorney, Agent, or Firm*—McAulay Fisher Nissen Goldberg & Kiel

[57] ABSTRACT

In a process for the deposition of a film of an inorganic substance such as silicon carbide on the surface of a substrate such as a silicon wafer by the method of sputtering, as in the process for the preparation of a membrane to serve as an X-ray lithographic mask, using a target disc and a substrate disc held in parallel to each other, uniformity in the internal stress of the deposited film can be improved by displacing the target or the substrate relative to each other during the sputtering procedure in the direction parallel to the surface of the target or substrate in a distance of at least 1 mm.

4 Claims, 1 Drawing Sheet

FILM-FORMING ON SUBSTRATE BY SPUTTERING

BACKGROUND OF THE INVENTION

The present invention relates to an improvement in the process for forming a thin film of an inorganic substance on the surface of a substrate by the method of sputtering. More particularly, the invention relates to an improvement in the process of film-forming of an inorganic substance on the surface of a substrate, as in the method for the preparation of a membrane to serve as a mask for X-ray lithography, by the sputtering method to cause deposition of the inorganic substance on the substrate surface.

As is known, the method of X-ray lithography is highlighted as a promising technoilogy in the near future for fine patterning in the manufacture of various kinds of semiconductor devices along with the recent trend toward more and more increased fineness in patterning. The X-ray lithography is performed by using a membrane of an X-ray permeable inorganic substance such as boron nitride, silicon carbide, silicon nitride and the like as a mask bearing a pattern formed of an X-ray-impermeable substance. Such a membrane of an X-ray-permeable substance is prepared by the deposition of a thin film of the substance on the surface of a substrate by the method of chemical vapor-phase deposition (CVD) or sputtering followed by removal of the substrate to leave the thin film in the form of an unsupported but framed membrane.

Each of the above mentioned CVD method and sputtering method has its own advantages and disadvantages as a method for film-forming on the substrate surface. For example, the CVD method, in which the film is deposited on the substrate surface by the reaction and decomposition of the gaseous reactant materials in the vapor phase, is subject to a problem that impurities, such as an undesirable element and the like, formed in the vapor-phase reaction are sometimes taken into the deposited film so as not to give a satisfactory membrane due to occurrence of pinholes and nodules on the surface while such an impurity in the membrane of the X-ray mask is sometimes removed by the irradiation with X-rays so that the membrane is subject to various defects such as appearance of distortion, variation in the stress, decrease in the mechanical strengths, decrease in the optical transparency and so on.

The sputtering method, on the other hand, has another problem. In the high-frequency magnetron sputtering method which is undertaken in most cases of sputtering in view of the high efficiency as compared with other types of sputtering method, the thin film deposited on the substrate surface is not very uniform on the whole area in respect of the internal stress. It is usual as a trend that, when sputtering is performed with parallel-disc electrodes, the internal stress is lower in the central region of the deposited film, which faces the center of the target during sputtering, than in the peripheral region. When a membrane is prepared from such an unevenly stressed film deposited on the substrate surface, rupture of the membrane sometimes starts at the central region under a lower stress or creases or wrinkles are sometimes formed in the central region greatly affecting the quality of the X-ray lithographic mask. Accordingly, it is eagerly desired to develop an improved sputtering method by which high uniformity is ensured in the internal stress of the sputtering-deposited film on a substrate surface from which high-quality X-ray lithographic masks can be prepared in a high yield.

SUMMARY OF THE INVENTION

The present invention accordingly has an object to provide an improved sputtering method for the deposition of an inorganic substance on the surface of a substrate, by which high uniformity is ensured in the internal stress of the deposited film on the substrate surface so as to be freed from the disadvantages of occurrence of rupture or creases in the membrane prepared from the deposited surface film.

Thus, the present invention provides an improvement, in the process for the formation of a thin film of an inorganic substance deposited on the surface of a substrate by sputtering in which a target made from the inorganic substance in the form of a disc and a substrate in the form of a disc, on which the thin film is deposited by sputtering, are held in parallel in an atmosphere of a reduced pressure and a high-frequency electric power is applied therebetween to cause sputtering, which comprises displacing the target and the substrate relative to each other during the process of sputtering in the direction in parallel to the surface of the target or substrate keeping the parallelism therebetweem.

The relative displacement of the target and substrate can be performed as a continuous movement or as an intermittent movement and the distance of the displacement is preferably at least 1 mm.

BRIEF DESCRIPTION OF THE DRAWING

The FIGURE schematically illustrates one of nine silicon wafers as the substrate having a small square region indicated by ① to ⑨ in a checkerboard arrangement, on which a film of silicon carbide and the like was deposited by sputtering to examine the uniformity, among the nine regions, of the internal stress of the deposited film followed by conversion of the deposited film into a membrane in one of the nine square regions.

DETAILED DESCRIPTION OF THE PREFERRED EMBODIMENTS

Figure 1:
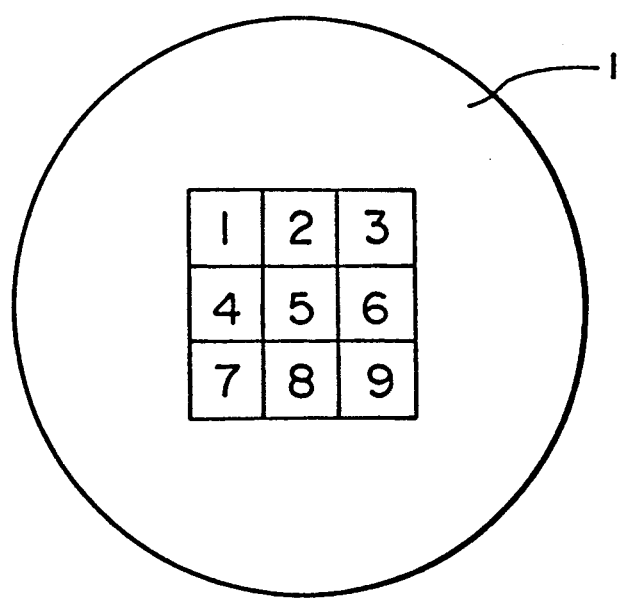

As is described above, the most characteristic feature in the inventive improvement consists, in contrast to the conventional sputtering method in which the relative disposition of the target and the substrate is kept unchanged throughout the sputtering process, in the relative displacement of the target and the substrate held in parallel during proceeding of the sputtering deposition of the inorganic substance to form a thin film on the substrate surface.

The improvement of the invention is applicable to the sputtering process for the deposition of any inorganic substance on the substrate surface although the advantages of the inventive improvement are very remarkable in the preparation of a membrane for an X-ray lithographic mask for which high uniformity in the internal stress of the membrane is essential.

The improvement of the invention is applicable to the sputtering method in general regardless of the type of sputtering but the so-called high-frequency magnetron sputtering method is preferable in respect of the high efficiency to ensure a high rate of film deposition which is essential for mass production. In the sputtering method, the target made from a substance to form the deposited film and the substrate each in the form of a plane disc are held in parallel, usually, up and down just to face each other in an atmosphere of a reduced pressure filled with an inert gas such as argon, xenon, helium and the like, optionally, with admixture of other gases such as nitrogen, hydrocarbons, e.g., methane and ethane, and the like when so-called reactive sputtering is to be performed. The pressure of the sputtering atmosphere has a substantial influence on the internal stress of the film deposited on the substrate surface. In order that the internal stress of the deposited film is tensile having a specified value suitable for the membrane preparation, the pressure is preferably in the range from 0.001 to 0.1 Torr.

The substance from which the target is prepared naturally depends on the substance forming the desired membrane or film deposited on the substrate surface without particular limitation. When the sputtering film-formation is conducted for the preparation of an X-ray lithographic mask membrane, for example, substances proposed therefor include boron nitride, silicon carbide, silicon nitride, silicon dioxide, boron carbide and the like either alone or as a combination of two kinds or more to form a composite such as silicon carbide-silicon nitride. Silicon carbide, silicon nitride and a composite thereof, i.e. silicon carbide-silicon nitride, are particularly preferred in respect of the high X-ray transmissivity and optical transparency to ensure exactness in the alignment of the mask as well as in respect of the stability against irradiation with X-rays to ensure good durability of the membrane mask. The target is prepared by compression-molding the substance in a powdery form into a disc which is subjected to sintering at a high temperature depending on the particular substance according to a well established procedure. The substance forming the target should desirably have a purity as high as possible in order that the deposited film may have a high purity to ensure good quality of the membrane. In this regard, the purity should be at least 99% or, desirably, 99.9% by weight in the preparation of an X-ray lithographic mask membrane.

The material forming the substrate is not limitative depending on the particular application of the membrane. When the sputtering is performed for the preparation of an X-ray lithographic mask membrane, it is usual that a substrate of fused quartz glass or high-purity silicon is used as the substrate in consideration of the heat resistance of the material to withstand the elevated temperature at which the substrate is heated and kept during the sputtering process as well as the good adhesion to the deposited film and high smoothness of the surface of the substrate made from these materials in the form of a disc or wafer. Namely, the temperature of the substrate should be 100° C. at the lowest but it is preferable to keep the substrate at a higher temperature as high as possible in order to ensure good adhesion of the deposited film to the substrate surface.

In the sputtering process, the above described target and the substrate each in the form of a disc are held up and down in parallel to face each other and a high-frequency electric power is applied therebetween. The electric power should be as high as possible because the rate of film deposition depends on the electric power. It is desirable that the electric power is at least 5 watts per $cm^2$ area of the target surface. The sputtering process is continued by the application of the high-frequency electric power until the film deposited on the substrate surface has a thickness of about 0.5 to about 3.0 $\mu m$ when an X-ray lithographic mask membrane is desired. When the thickness is too small, the membrane prepared from the deposited film has poor mechanical strengths not to be processable into a membrane or not to ensure durability of the membrane prepared therefrom. When the thickness of the deposited film is too large, the membrane prepared therefrom has a decreased optical transparency.

As is mentioned before, the most characteristic feature of the improvement by the present invention consists in the relative displacement of the target and the substrate to each other during the process of sputtering. This is in contrast to the conventional sputtering method in which the relative disposition of the target and the substrate is stationary throughout the sputtering process. The relative displacement of the target and/or substrate is performed within the plane in parallel to the surface of the target or substrate keeping the parallelism therebetween. When the target and the substrate are held up and down vertically each to face the other as is the case in most of the currently available sputtering apparatuses, namely, the displacement is made in the horizontal direction. The manner of the displacement is not limited to a straightly linear movement but the movement can be along a curved line as in a revolutionary movement around an axis. At any rate, the distance of the relative displacement should be at least 1 mm or, preferably, at least 2 mm for each point on the surface of the target or substrate. Though not limitative, the distance of the displacement should not exceed 10 mm or, preferably, 5 mm because no particular additional advantages can be obtained by so increasing the distance of the displacement even when permitted by the apparatus conditions. The displacement can be performed either in a continuous reciprocative movement or in an intermittent movement in alternately reversed directions.

Since the scope of the inventive improvement consists in the relative displacement of the target and the substrate, it is optional that either one of the target and the substrate is moved or both of them are moved to effect the desired relative displacement. It is, however, usual that the substrate is moved with the target kept unmoved since most of the currently available sputtering apparatuses are so designed. The relative displacement of the target and the substrate is performed by keeping the parallelism without changing the distance therebetween in the perpendicular direction because changes in the distance therebetween greatly affect the rate of film deposition to cause a complicated problem without particular advantages.

As to the frequency of the relative displacement of the target and substrate, it is desirable that the displacement is performed as frequently as possible if it is not too troublesome or permitted by the apparatus conditions although a single displacement is sufficient in certain cases during the sputtering process. When two times or more of intermittent displacements are undertaken, the successive displacing movements can be in the same direction or in the reverse directions so that the displacing movements are conducted repeatedly back and forth or to the right and left. It is essential that each displacement is preceded and succeeded by a substantial increment in the thickness of the deposited film although the increment in the thickness of the deposited film before preceding and succeeding each displacement should not exceed 1.0 $\mu m$. For example, it is not fully effective that a single displacement is undertaken immediately after the start of the sputtering without being followed by a second displacement or that a single displacement is undertaken just before termination of the sputtering without being preceded by another displacement. In this regard, each displcement should preferably be preceded and succeeded by an increment in the thickness of the deposited film in the range from 0.01 μm to 0.1 μm. When the displacement is conducted in a continuously repeated cycles of back and forth reciprocative movement, the increment in the thickness of the deposited film during a half cycle of the reciprocative movement should be in the range from 0.01 μm to 0.1 μm. When the displacement is undertaken in a continuous movement of the target or substrate, the velocity need not be so large as to exceed the moving distance of 1 mm in a length of time during which the increment in the deposited film thickness is 0.1 μm but should be large enough to have a moving distance of 1 mm in a length of time during which the increment in the deposited film thickness is 0.01 μm.

After completion of the film formation by the deposition on the substrate surface in the above described manner, the substrate is removed off from the deposited film by a suitable method such as etching on a specified area leaving a portion to serve as a frame for the membrane of the inorganic substance. It is important in order to obtain a membrane having high mechanical strengths that the film deposited on the substrate surface is under a tensile internal stress in the range from 0.1 to $10.0 \times 10^9$ dyn/cm$^2$ or, preferably from 0.5 to $5.0 \times 10^9$ dyn/cm$^2$. When the internal stress is tensile but outside the above mentioned range or is compressive, no satisfactory membrane can be prepared from the deposited film.

The film of the inorganic substance deposited on the substrate surface by sputtering according to the improvement of the invention is very uniform in respect of the internal stress over the whole area of the film as formed so that the membrane prepared from the surface-deposited film ia very strong without the troubles of eventual rupture and free from occurrence of creases or wrinkles with excellent smoothness of the surface so that it is useful not only as an X-ray lithographic mask membrane but also as a membrane material for other purposes.

In the following, the improvement of the invention is described in more detail by way of examples and comparative examples which, however, should not be construed to limit the scope of the invention in any way.

EXAMPLE 1

A target of silicon carbide having a purity of 99.9% in the form of a disc of 3 inches diameter and 5 mm thickness prepared by a conventional sintering method was set on the cathode in the sputtering chamber of a high-frequency magnetron sputtering apparatus (Model SPF-332H, a product by Nitiden Anelva Co.). A high-purity silicon wafer polished on both surfaces having a diameter of 3 inches and a thickness of 600 μm was set as a substrate just to face the above mentioned silicon carbide target in a parallel disposition. Namely, the line connecting the centers of the target and the substrate was perpendicular to the surface of the target and substrate. This disposition is called the neutral disposition hereinbelow. The sputtering chamber was then closed and evacuated and the pressure inside the chamber was kept at 0.05 Torr by the balance of the continued evacuation and continuous introduction of argon gas at a rate of 7 ml per minute by means of a valve on the duct communicating with the evacuation system.

While keeping the substrate at a temperature of 300° C., a high frequency electric power at a frequency of 13.56 MHz was applied between the target and the substrate to start sputtering. The electric power density was 10 watts per cm$^2$ area of the target surface. The sputtering process was continued for 15 minutes in the above described manner so that the silicon carbide film deposited on the substrate surface had a thickness of about 1.0 μm. During this 15 minutes period of sputtering, the substrate was moved reciprocatively to the right and left starting from the above mentioned neutral disposition in an amplitude of 6 mm so that the center point of the target disc was brought to face the substrate disc along a 6 mm long line extending to both sides of the center point of the substrate surface.

The internal stress of the thus deposited silicon carbide film was tensile having a value of $2.4 \times 10^9$ dyn/cm$^2$ as calculated from the change in the warping of the silicon wafer bearing the silicon carbide film deposited thereon. Namely, the above mentioned value of the tensile stress was obtained as an average over the whole surface area of the deposited film.

EXAMPLE 2

The experimental procedure was substantially the same as in the above described Example 1 except that the relative displacement of the target and the substrate was effected by the intermittent and jerking movement of the substrate first rightwardly in a distance of 3 mm and then leftwardly twice each in a distance of 3 mm followed by a repetition of each twice of the rightward and leftward movements each time in a distance of 3 mm at 1 minute intervals after the start of the sputtering.

The silicon carbide film deposited on the substrate surface in the above described manner had a tensile internal stress of $2.5 \times 10^9$ dyn/cm$^2$ as an average for the whole area.

EXAMPLE 3

The experimental procedure was substantially the same as in the above described Example 2 except that the interval of the intermittent movements of the substrate was 3 minutes instead of 1 minute.

The silicon carbide film deposited on the substrate surface in the above described manner also had a tensile internal stress of $2.5 \times 10^9$ dyn/cm$^2$.

EXAMPLE 4

The experimental procedure was substantially the same as in the above described Example 2 except that the target disc was prepared from an equimolar blend of silicon carbide and silicon nitride and the pressure inside the sputtering chamber was kept at 0.06 Torr instead of 0.05 Torr.

The composite film deposited on the substrate surface in the above described manner had a tensile internal stress of $1.8 \times 10^9$ dyn/cm$^2$.

EXAMPLE 5

The experimental procedure was substantially the same as in the above described Example 4 except that the target disc was prepared from silicon nitride alone instead of a blend with silicon carbide.

The silicon nitride film deposited on the substrate surface in the above described manner had a tensile internal stress of $2.9 \times 10^9$ dyn/cm$^2$.

COMPARATIVE EXAMPLES 1 to 3

The experimental procedure in each of these Comparative Examples 1 to 3 was substantially the same as in the above described Examples 1, 4 and 5, respectively, except that the substrate was kept unmoved during the sputtering process.

The films deposited on the substrate surfaces in the above mentioned manner had tensile internal stresses of 2.4, 2.2 and $1.9 \times 10^9$ dyn/cm², respectively.

UNIFORMITY IN THE DISTRIBUTION OF INTERNAL STRESS

Since the distribution of the internal stress over the whole surface of the deposited film could not be evaluated by the warping measurement, nine specimens of the silicon wafers having a film deposited thereon were prepared in the same manner as under the conditions in each of the above described Examples 1 to 5 and Comparative Examples 1 to 3 and the silicon substrate was removed in differently localized areas from these nine specimens as described below to convert the deposited film into an unsupported membrane in the localized area to make comparison for the condition of the membranes in different areas on the substrates.

Thus, each of the 9 substrate wafers was provided on the back surface with a deposited film of amorphous boron nitride having a thickness of 0.5 μm by the plasma CVD method to serve as a resist layer against wet-process etching with an etching solution of potassium hydroxide. The back surface of the substrate wafer having the resist layer was masked with a stainless steel mask plate having a 10 mm by 10 mm square opening in one of the checkerboard arrangement of nine 10 mm by 10 mm squares marked ① to ⑨ as illustrated in the figure of the accompanying drawing and the resist layer of amorphous boron nitride in the thus exposed area was removed by dry etching with carbon tetrafluoride gas containing 4% by volume of oxygen. Then, the silicon wafer in the thus unprotected area was dissolved away by wet etching with a 15% aqueous solution of potassium hydroxide to convert the deposited film into an unsupported membrane in the 10 mm by 10 mm area. The condition of the membranes formed in this manner in the different areas on the nine substrate wafers was visually examined.

The results of this visual inspection test were that the condition of the membrane was quite satisfactory in all of the nine areas in each of Examples 1 to 5 while some creases were found in the areas ④, ⑤ and ⑥ in Comparative Example 1, in the areas ④ and ⑤ in Comparative Example 2 and in the areas ⑤ and ⑧ in Comparative Example 3.

What is claimed is:

1. In a method for the preparation of a thin film of an inorganic substance on the surface of a substrate plate for use as a masking transparency for X-ray lithography by the high-frequency magnetron method wherein a substrate plate and a target plate of the inorganic substance are held in spaced-apart opposing parallel positions and high frequency electric power is applied therebetween to cause sputtering, the improvement which comprises:

(a) holding the substrate plate and the target plate in an inert atmosphere under a reduced pressure;
    (b) depositing a film of the inorganic substance onto the surface of the substrate by sputtering for a length of time sufficient to deposit a film having a thickness of no more than 1.0 μm;
    (c) moving the plates in a parallel direction relative to one another to cause a displacement from the original position of from 1 to 10 mm and depositing a film of the inorganic substance onto the surface of the substrate by sputtering for a length of time sufficient to deposit an additional film coating having a thickness of no more than 1.0 μm while the plates are in the displaced position; and
    (d) repeating steps (b) and (c) until a film of the desired thickness having a uniform internal tensile stress in the range from 0.1 to $10.0 \times 10^9$ dyn/cm² on the surface of the substrate plate is obtained.

2. The method of claim 1 wherein the amount of displacement is from 1 to 5 mm.

3. The method of claim 1 wherein each displacement is preceded and succeeded by an increment in the thickness of the deposited film in the range from 0.1 to 0.1 μm.

4. The method of claim 1 wherein the method is carried until a film having the desired thickness and a uniform internal tensile stress in the range from 0.5 to $5.0 \times 10^9$ dyn/cm² is achieved.

* * * * *